United States Patent [19]
Burns

[11] 3,962,607
[45] June 8, 1976

[54] LOUDSPEAKER PROTECTIVE SYSTEM

[75] Inventor: Wade D. Burns, Roslyn, Pa.

[73] Assignee: Dynaco Inc., Blackwood, N.J.

[22] Filed: June 5, 1974

[21] Appl. No.: 476,389

[52] U.S. Cl. ............................. 317/31; 317/36 TD; 330/207 P
[51] Int. Cl.² ...................... H02H 3/20; H02H 7/20
[58] Field of Search ...... 317/31, 33 UR, 16, 36 TD, 317/52, 33 R; 307/24, 235 A, 264, 202, 317 R, 317 A; 330/207 P; 328/140, 150

[56] References Cited
UNITED STATES PATENTS

| | | | |
|---|---|---|---|
| 3,204,124 | 8/1965 | Durio, Jr. | 328/140 |
| 3,564,338 | 2/1971 | Teshirogi et al. | 317/31 |
| 3,609,407 | 9/1971 | Garuts | 307/235 A |
| 3,634,871 | 1/1972 | Siedband et al. | 317/31 |
| 3,818,274 | 6/1974 | Dewitte et al. | 317/31 |

*Primary Examiner*—Gerald Goldberg
*Assistant Examiner*—Patrick R. Salce
*Attorney, Agent, or Firm*—Schiller & Pandiscio

[57] ABSTRACT

A protective circuit for a loudspeaker connected to the output of an audio amplifier, in which a predetermined fraction of the voltage derived from the output of the power amplifier is peak rectified and stored in an accumulator provided with resistors for leaking charge from the accumulator at a predetermined rate. The voltage across the storage capacitor is normally maintained blocked in respect to application to a diode control circuit for by-passing input signal to the power amplifier. When the voltage across the storage capacitor attains a sufficiently high value, control signal is applied to oppositely poled diodes, to vary their back biases, and the diodes provide a controlled shunt path to ground for peaks of the signal applied to the input to the power amplifier.

8 Claims, 1 Drawing Figure

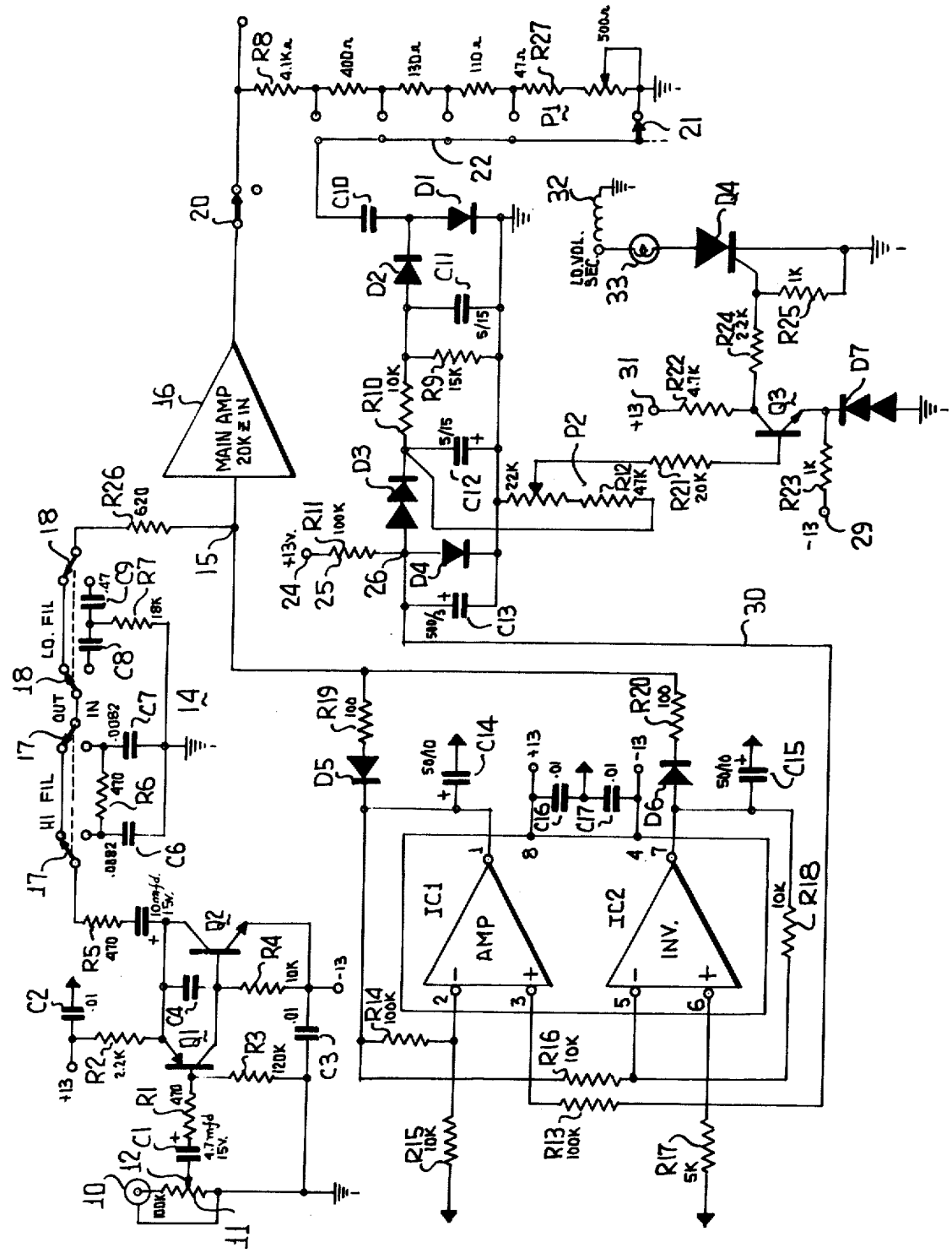

LOUDSPEAKER PROTECTIVE SYSTEM

BACKGROUND OF THE INVENTION

Various devices have heretofore been used to protect loudspeakers connected to the outputs of high power audio amplifiers from excess signal amplitudes. One expedient used for this purpose is a limiting circuit which clips the output of the amplifier at a level which is not dangerous to the loudspeaker. Another expedient which is sometimes employed is a compressor circuit. When a limiter or clipping circuit is employed, distortion results since waveforms are always clipped at some predetermined level. Compressor circuits, on the other hand, are found to have undesirable listening characteristics.

In accordance with the present invention, the assumption is made that the speakers used with high power amplifiers can accommodate frequent peaks well above their nominal power ratings, provided these occur for short intervals only. It is, therefore, desirable to provide a protective circuit for loudspeakers which permits peaks to pass through, thereby retaining fidelity of reproduction. It is, however, also important to reduce the inputs of the loudspeaker when sustained high level outputs occur which are beyond the longer term capability of the loudspeaker. It is also desirable to provide a visual indicator of the fact that the loudspeaker is being subjected to nearly overload conditions, in order that ameliorative action may be taken before actual overload occurs.

In accordance with the present invention, no distortion frequency response or output level changes are introduced in the output of a power amplifier, so long as the long term voltage applied to the loudspeaker fails to exceed a predetermined set level, and despite the fact that short peaks of excess voltage may occur. Upon sensing a sustained overload, by means of an integrating circuit for a peak voltage output sensing device, controlled shunting effect is introduced at the input of the amplifier, so that the net signal applied to the input of the amplifier is reduced only enough to avoid sustained overvoltage. No distortion occurs on short term overvoltage, but rather the peak input to the amplifier is reduced in response to long term overvoltage to a level which provides an output that the loudspeaker can sustain. When the integrated output voltage attains a predetermined value, input signal by-passing action commences, but the extent of by-passing is a function of the extent of overvoltage. Just before the selected level is achieved, an overload indicating lamp is illuminated. By means of the present system, the amplifiers can pass to the loudspeaker very short peaks up to the level at which the amplifier clips, and it can pass longer duration peaks of intermediate power, so long as the average power level is substantially below the set threshold. As power output rises the extent of by-pass is increased, but only sufficiently that the loudspeaker is fully protected. The overload lamp can be turned on about 1 db below the threshold at which protective signal limiting commences. The circuit does not latch in, and shortly after cessation of the overdrive, full input signal is restored to the main amplifier, by-passing being continued only until the integrated signal level drops below the threshold. At that point the indicating lamp has become extinguished.

SUMMARY OF THE INVENTION

A system for protecting loudspeakers driven by audio power amplifiers by shunting the input to the main amplifier adjustably only when the average output voltage of the amplifier exceeds the capabilities of the loudspeaker for a sufficiently long time, and for adjusting the shunting effect to the minimum extent required as a function of the extent of overload, the shunting effect being terminated automatically several seconds after the sustained overload has terminated.

DETAILED DESCRIPTION OF A PREFERRED EMBODIMENT

In the single FIGURE of the drawing, 10 is a signal input terminal for an audio signal representing one channel of a stereo system. Potentiometer 11 extends from terminal 10 to ground, and the slider 12 of the potentiometer is coupled to a series circuit including capacitor C1 and resistance R1 to the base of PNP transistor Q1. Q1 and Q2 and the accompanying circuit elements represent a conventional isolating preamplifier, applying signal through filters 14, to input terminal 15 of the power amplifier 16. The filters 14 have selector switches 17, 18, which either transfer signal directly to the terminal 15 or which connect in circuit the RC filters comprising C6, R6, C7, C8, C9, R7. If only switch contacts 18 are moved to the down position, the filter then acts as a low pass filter, whereas if only switch contacts 17 are in the down position, the filter acts as a high pass filter. If both switch contacts 17 and 18 remain up, there is no filtering action.

The output of the main amplifier 16 appears at a terminal 20. Across the terminal 20 is connected a potentiometer P1 consisting of a number of series resistances between terminal 20 and ground and of a slider 21, which can be moved to connect to the junctions of any two of the resistances. Thereby a desired proportion or fraction of the output signal becomes available on lead 22. That signal is essentially clamped to slightly above ground potential in a positive sense by D1 and the negative part of the audio signal is rectified by D2 and accumulated in a capacitor C11. D2 and C11 provide a rectified peak negative value corresponding with the peak negative value of the audio signal. The voltage across the capacitor C11 is stored in an accumulator C12 through resistance R10, which is of relatively small value so that the charging of C12 is relatively rapid. Discharge of the accumulator C12 occurs through R10, R9 in series and since R9 is a 15.K resistance, while R10 is a 10.K resistance, discharge is relatively slow.

A positive voltage terminal 24 provides 13 volts through a resistance 25 to a diode D4. The voltage across D4 is thereby 0.7 volts, and this voltage back biases the series diodes D3. D3 will start conducting when the voltage at its cathode becomes more negative than −0.7 volts. Additionally, when D3 conducts, D4 becomes inoperative to act as a positive voltage source of 0.7 volts, since the voltage at point 26 is reduced.

Amplifier IC1 is a 20. db voltage amplifier, while amplifier IC2 serves as a unity gain inverter. While D4 is conducting a positive voltage is supplied over lead 30 to terminal 3 of IC1, causing that amplifier to provide at its output terminal 1 about 5.5 volts to the cathode of diode D5. The voltage at the cathode of D5 is applied to terminal 5 of IC2, inverted at unity gain, and thereby provides a negative voltage of about 5.5 volts to the anode of D6. In consequence, when D4 provides a 0.7 volt reference voltage, indicating that C12 does not have a large negative accumulated voltage, D5, D6 are heavily reverse biased and have no effect upon the audio signal present at the terminal 15.

When D3 conducts, indicating abnormal amplifier output voltage, the voltage at terminal 26 drops, and the voltages appearing on the cathode of D5 and the anode of D6 correspondingly decrease. As the back bias voltages on D5 and D6 decrease, a clipping or shunting path for audio signal at the terminal 15 exists, the path extending through R14, R15, for dc and through C14 for ac in the case of D5, and through R18, R16, R14 for dc in the case of D6, and through C15 for ac in the case of D6.

The result of providing clipping or by-passing action through diodes D5, D6, is to reduce the output of the main amplifier 16, as seen at the point 20, which in turn decreases the signal to IC1, thus tending to keep the limited voltage constant.

The present system continuously monitors the rectified and integrated output voltage from a power amplifier. This voltage is an indication of the power available to a load on the amplifier output, whether or not a load is connected, i.e., the system is responsive to voltage. When the integrated value exceeds the reference or permissible level, limiting action commences. So long as the activation threshold of the system is not attained the system is totally ineffective to affect output signal in respect to amplitude distortion or in any other way. The threshold voltage of the system, as reflected at accumulator C12, is not responsive to sudden short surges of current since in response to such surges, capacitor C12 does not accumulate sufficient voltage to turn on D3, and repetitive surges of voltage do not affect the system because accumulator C12 has time to discharge between surges. The system, accordingly, only responds to a steady voltage of sufficiently high level sustained for a sufficiently long time, on an integrated basis.

Diodes D7 maintain a constant −1.4 volts on the emitter of Q3, since diodes D7 are connected in series with a relatively large resistance to a voltage at negative terminal 29. So long as the voltage on accumulator C12 is low, Q3, which has +13 volts applied to its collector from terminal 31, remains saturated, keeping the gate of thyristor Q4 below firing level. Potentiometer P2 is adjusted so that Q3 will turn off just enough to provide a positive gate voltage signal for Q4 when the accumulator voltage at C12 becomes high enough to initiate action of the guard circuit for the main amplifier 16. Q4 is driven from a transformer secondary 32, and, accordingly, fires at every positive swing of the secondary winding voltage, turning on the indicator lamp 33. By adjustment of the slider of the potentiometer P2, lamp 33 may be caused to turn on slightly before the guard circuit for the main amplifier 16 has any effect, thereby providing an early warning that the guard circuit for the main amplifier 16 is approaching operation. While the circuit for control of thyristor Q4 is, as illustrated, controlled directly by the voltage across accumulator C12, the same effect can be attained by controlling Q3 through a potentiometer directly from the voltage at the anode D6, if desired. The two control voltages are not equal but they vary in corresponding fashion, so that either one may be utilized as desired.

What is claimed is:

1. In a protective circuit, a loudspeaker, a source of audio signal, a power amplifier having an input terminal and an output terminal, means connecting said source to said input terminal, means connecting said loudspeaker to said output terminal, means for deriving a predetermined fraction of the voltage at said output terminal at a further terminal, means rectifying the voltage on said further terminal and deriving a peak rectified voltage, accumulator means for accumulating said peak rectified voltage, said accumulator means having a relatively long time constant on discharge and a relatively short time constant on charge, a voltage responsive control circuit, means coupling said accumulator means to said voltage responsive control circuit, said means coupling including diode means poled to be forward biased by the voltage of said accumulator means, reference voltage means biasing said diode means to render said diode means non-conductive of said voltage of said accumulator means only while said voltage of said accumulator means is below a predetermined level indicative of a safe level of voltage drive of said loudspeaker, and means responsive to conductivity of said diode means for controlling by-pass of peaks of voltage at said input terminal as a function of said voltage of said accumulator means only sufficiently to reduce voltage into said loudspeaker to said safe level.

2. The combination according to claim 1, including means responsive to said voltage of said accumulator means for operating a visual indicator only in response to at least a predetermined fraction of said voltage of said accumulator means.

3. The combination according to claim 1, wherein said reference voltage means includes further diode means connected in a loop consisting of said diode means, said accumulator means and said further diode means, a source of dc voltage, a voltage dropping resistance, means connecting said source of dc voltage, said resistive voltage dropping resistance and said further diode means in a series circuit.

4. The combination according to claim 3, wherein said means for controlling bypass includes back to back diodes connected between said input terminal and ground, and means responsive to the voltage across said further diode for back biasing said back to back diodes.

5. A system for protecting an audio amplifier load from audio overvoltage provided by an audio amplifier, comprising means responsive to the peak output voltage of said amplifier for time averaging said peak output voltage and means responsive to the time averaged peak output voltage for reducing said over voltage by controllably by-passing audio input voltage to said amplifier only by such amounts directly related to the excess of said averaged peak output voltage above a predetermined limiting value so as to limit said peak output voltage to said predetermined limiting value, wherein said means responsive to the time averaged peak output voltage includes a storage capacitor for storing said time averaged peak output voltage, at least a first diode, at least a second diode, means connecting corresponding electrodes of said at least a first diode and said at least a second diode to a common junction, means connecting the remaining electrodes of said at least a first diode and said at least a second diode to opposite plates of said storage capacitor, a source of dc voltage, a resistance, means connecting said source of voltage and said resistance in series with said at least a second diode, the polarity of said at least a second diode and of said source of voltage being such that said at least a second diode is conductive, and the polarity of the voltage on said storage capacitor being such as to forward bias said at least a first diode.

6. The combination according to claim 5 wherein said at least a first diode is two diodes and said at least a second diode is a single diode.

7. A control circuit, including a storage capacitor, a charging resistance connected in series with said capacitor, a discharging resistance in shunt to said capacitor, said discharging resistance being larger than said charging resistance, a source of dc positive voltage greater than several volts, a further resistance, a first diode, a circuit connecting said source, said further resistance and said first diode in the order named in a first conductive circuit, a second pair of series diodes having a cathode connected to said capacitor and an anode connected to the junction of said first diode and said resistance, means deriving a control voltage from said junction, and means charging said capacitor negatively to a variable extent.

8. The combination according to claim 7, wherein is provided a power amplifier, peak rectifying means responsive to the output of said amplifier for supplying voltage to said means for charging, and diode means responsive to said control voltage for controllably clipping input signal from said amplifier.

* * * * *

UNITED STATES PATENT OFFICE
CERTIFICATE OF CORRECTION

PATENT NO. : 3,962,607

DATED : June 8, 1976

INVENTOR(S) : Wade D. Burns

It is certified that error appears in the above-identified patent and that said Letters Patent are hereby corrected as shown below:

Column 4, Claim 1, Line 5, the word "for" should come before the word "rectifying".

Signed and Sealed this

Third Day of August 1976

[SEAL]

Attest:

RUTH C. MASON
Attesting Officer

C. MARSHALL DANN
Commissioner of Patents and Trademarks